United States Patent
Kim et al.

(10) Patent No.: US 7,323,808 B2
(45) Date of Patent: Jan. 29, 2008

(54) PLASMA DISPLAY PANEL ASSEMBLY INCLUDING HEAT ABSORPTION LAYER

(75) Inventors: Myoung-Kon Kim, Asan-si (KR); Tae-Kyoung Kang, Asan-si (KR); Won-Kyu Bang, Asan-si (KR); Ki-Jung Kim, Cheonan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 501 days.

(21) Appl. No.: 10/934,698

(22) Filed: Sep. 7, 2004

(65) Prior Publication Data

US 2005/0067963 A1    Mar. 31, 2005

(30) Foreign Application Priority Data

Sep. 25, 2003    (KR) .................... 10-2003-0066495

(51) Int. Cl.
*H01J 17/49*    (2006.01)
(52) U.S. Cl. .................... 313/44; 313/582; 361/681
(58) Field of Classification Search ........ 313/582–587, 313/44, 46; 361/681, 687
See application file for complete search history.

(56) References Cited

U.S. PATENT DOCUMENTS

| | | | |
|---|---|---|---|
| 5,811,923 A | 9/1998 | Zieba et al. | |
| 5,831,374 A | 11/1998 | Morita et al. | |
| 6,700,315 B2* | 3/2004 | Kim et al. | 313/46 |
| 7,176,605 B2* | 2/2007 | Bae et al. | 313/46 |

FOREIGN PATENT DOCUMENTS

KR    P2001-0036572    5/2001

OTHER PUBLICATIONS

Korean Office Action of the Korean Patent Application No. 10-2003-0066495, mailed on Oct. 26, 2005.
Korean Office Action of the Korean Patent Application No. 10-2003-0066495, issued on Apr. 13, 2006.

* cited by examiner

*Primary Examiner*—Joseph Williams
(74) *Attorney, Agent, or Firm*—Robert E. Bushnell, Esq.

(57) ABSTRACT

A plasma display panel assembly includes a panel assembly, a chassis base affixed to a rear surface of the panel assembly by an adhesive member, a printed circuit board mounted on a rear surface of the chassis base, a case for containing the panel assembly, the chassis base and the printed circuit board, and a heat absorption layer adapted to absorb heat generated by the panel assembly.

27 Claims, 10 Drawing Sheets

PLASMA DISPLAY PANEL ASSEMBLY INCLUDING HEAT ABSORPTION LAYER

CLAIM OF PRIORITY

This application makes reference to, incorporates the same herein, and claims all benefits accruing under 35 U.S.C. §119 from an application for PLASMA DISPLAY PANEL ASSEMBLY earlier filed in the Korean Intellectual Property Office on 25 Sep. 2003 and there duly assigned Ser. No. 2003-66495.

BACKGROUND OF THE INVENTION

1. Field of the Invention

The present invention relates to a Plasma Display Panel (PDP) assembly, and more particularly, to a PDP assembly that quickly dissipates heat generated during the operation thereof.

2. Description of the Related Art

Generally, a PDP assembly is a flat display device including front and rear panels having electrodes arranged at opposing surfaces thereof. A discharge gas fills a discharge cavity defined between the front and rear panels. When electrical power is supplied to the electrodes of the PDP assembly, ultraviolet rays are generated in the discharge cavity to emit light, thereby displaying an image.

That is, a panel assembly is formed by combining the front and rear panels together. A chassis assembly is arranged on a rear surface of the panel assembly, and a Printed Circuit Board (PCB) for transmitting an electrical signal to the panel assembly is arranged on the chassis assembly. After going through a series of test processes, the panel assembly, the PCB and the chassis assembly are arranged in a case, thereby realizing the PDP assembly.

The PDP assembly comprises a panel assembly having front and rear panels. A chassis base is affixed to a rear surface of the rear panel by adhesive tape. A heat conductive medium is disposed between the rear panel and the chassis base.

The PDP assembly is designed to dissipate heat generated during the operation thereof externally through the chassis base via the heat conductive medium.

The heat generated in the PDP assembly includes conduction heat transmitted from the panel assembly to the chassis base via the heat conductive medium and radiant heat generated in an enclosed inner cavity of the PDP assembly. The PDP assembly is not designed to quickly discharge the conduction heat and the radiant heat externally.

In order to discharge the conduction heat generated from the panel assembly, the heat conductive medium is disposed between the rear panel and the chassis base.

However, since the surfaces of the rear panel and the chassis base are uneven, e.g.—having a plurality of minute grooves, the adhesion of the heat conductive medium to opposing surfaces of the rear panel and the chassis base cannot be perfectly realized. As a result, air layers can be formed between the rear panel and the heat conductive medium and between the heat conductive medium and the chassis base.

Such air layers lower the conduction efficiency of the heat generated by the panel assembly, thereby deteriorating the color purity of the panel assembly and reducing the life of the PDP assembly. The adhesive strength of the heat conductive medium can be improved by increasing a compression force. However, in this case, barrier ribs of the PDP assembly can be collapsed.

Furthermore, the PDP assembly does not provide a light absorber that can effectively absorb light generated by a back discharge, thereby reducing contrast. Korean Laid-Open Patent Publication No. 1997-12900 discloses a technique in which a black stripe is formed between electrodes of a panel assembly to enhance the contrast. However, the light generated by the back discharge is not effectively absorbed.

SUMMARY OF THE INVENTION

The present invention provides a PDP assembly that can effectively dissipate conduction heat and radiant heat by providing a heat dissipating unit.

Also, the present invention provides a PDP assembly that can improve the heat conduction efficiency by enhancing adhesion of a chassis base to the PDP assembly.

According to an aspect of the present invention, a plasma display panel assembly is provided comprising: a panel assembly; a chassis base affixed to a rear surface of the panel assembly by an adhesive member; a printed circuit board arranged on a rear surface of the chassis base; a case adapted to receive the panel assembly, the chassis base and the printed circuit board; and a first heat absorption layer arranged in the case and adapted to absorb heat generated by the panel assembly.

According to another aspect of the present invention, a plasma display panel assembly is provided comprising: a panel assembly; a chassis base affixed to a rear surface of the panel assembly; a case adapted to contain the panel assembly and the chassis base; and a first heat absorption layer arranged in the case and adapted to absorb heat generated by the panel assembly.

The heat absorption layer preferably comprises a black material.

The black material preferably comprises a graphite-based material.

The heat absorption layer preferably includes a ceramic material adapted to improve a surface roughness of the heat absorption layer.

The ceramic material preferably comprises beryllia.

The heat absorption layer preferably covers an entire area of a front surface of the chassis base facing the rear surface of the panel assembly.

The heat absorption layer preferably partially covers a front surface of the chassis base facing the rear surface of the panel assembly to define an un-coated portion on the front surface of the panel assembly.

The plasma display panel assembly preferably further comprises a heat dissipating sheet arranged between the panel assembly and the chassis base, the heat dissipating sheet being affixed to the un-coated portion on the front surface of the panel assembly.

The plasma display panel assembly preferably further comprises a chassis member adapted to fix a flexible printed cable adapted to transmit electrical signals to the panel assembly, the chassis member being arranged on the chassis base.

The plasma display panel assembly preferably further comprises a second heat absorption layer arranged on a first surface of the chassis member and adapted to absorb heat generated by the flexible printed cable.

The plasma display panel assembly preferably further comprises a heat dissipating unit arranged on a second surface of the chassis member and adapted to dissipate the heat absorbed by the second heat absorption layer.

The heat dissipating unit preferably comprises a plurality of bosses integrally projecting from a second surface of the chassis member.

The heat dissipating unit preferably comprises a plurality of through holes arranged to pass through the chassis member.

The heat dissipating unit preferably comprises a plurality of bosses projecting from an outer surface of the chassis member and a plurality of grooves arranged on the first surface to respectively correspond to the plurality of bosses.

The plasma display panel assembly preferably further comprises a heat dissipating unit arranged on a rear surface of the chassis base.

The heat dissipating unit preferably comprises a plurality of projections arranged on the rear surface of the chassis base.

The heat dissipating unit preferably comprises a heat dissipating plate affixed to the rear surface of the chassis base and a plurality of projections arranged on the heat dissipating sheet.

The chassis base preferably includes a plurality of projections arranged on a front surface thereof.

The plurality of projections are either discontinuous or continuous.

The plurality of projections preferably include carbon nanotubes adapted to increase a heat dissipating area.

The plurality of projections are preferably formed by a process selected from the group consisting of etching, sandblasting, coating, and pressing.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
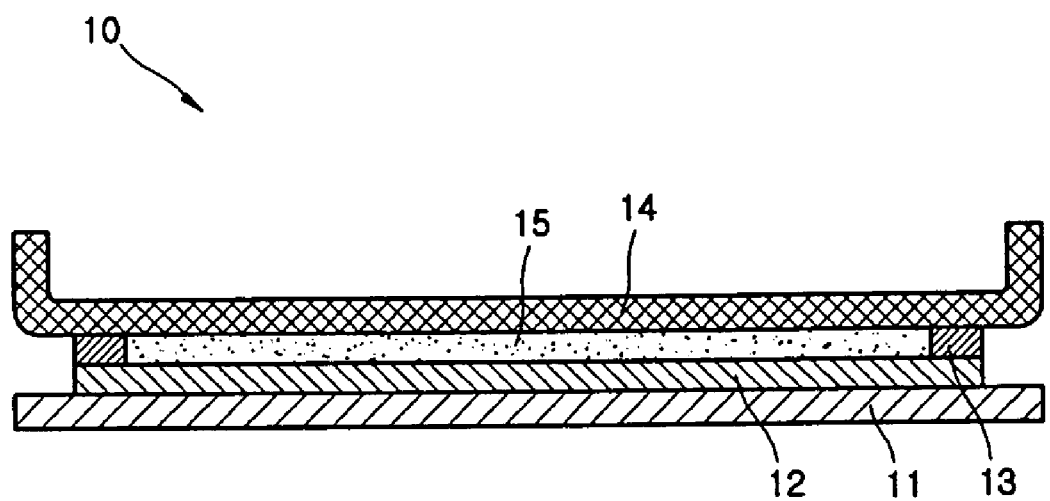
FIG. 1 is a sectional view of a PDP assembly.

Referring to FIG. 1, a PDP assembly 10 comprises a panel assembly having front and rear panels 11 and 12. A chassis base is affixed to a rear surface of the rear panel 12 by adhesive tape 13. A heat conductive medium 14 is disposed between the rear panel 12 and the chassis base 14.

The PDP assembly 10 is designed to dissipate heat generated during the operation of the panel assembly to an external side through the chassis base 14 via the heat conductive medium 15.

Generally, heat generated in the PDP assembly 10 includes conduction heat transmitted from the panel assembly to the chassis base 14 via the heat conductive medium 15 and radiant heat generated in an enclosed inner cavity of the PDP assembly. The PDP assembly 10 is not designed to quickly discharge the conduction heat and the radiant heat externally.

Figure 2:
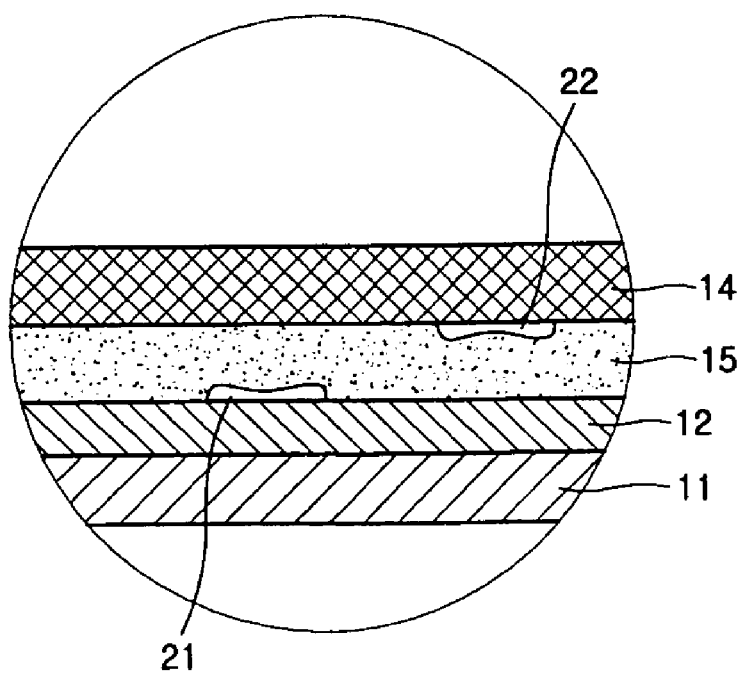
FIG. 2 is a partial enlarged view of the PDP assembly of FIG. 1.

As shown in FIG. 2, in order to discharge the conduction heat generated from the panel assembly, the heat conductive medium 15 is disposed between the rear panel 12 and the chassis base 14.

However, since surfaces of the rear panel 12 and the chassis base 14 are uneven, e.g.—having a plurality of minute grooves, the adhesion of the heat conductive medium 15 to opposing surfaces of the rear panel 12 and the chassis base 14 cannot be perfectly realized. As a result, air layers 21 and 22 can respectively be formed between the rear panel 12 and the heat conductive medium 15 and between the heat conductive medium 15 and the chassis base 14.

Such air layers lower the conduction efficiency of the heat generated by the panel assembly, thereby deteriorating the color purity of the panel assembly and reducing the life of the PDP assembly. The adhesive strength of the heat conductive medium 15 can be improved by increasing a compression force. However, in this case, barrier ribs of the POP assembly can be collapsed.

Furthermore, the PDP assembly does not provide a light absorber that can effectively absorb light generated by back discharge, deteriorating contrast.

The present invention will now be described more fully with reference to the accompanying drawings, in which exemplary embodiments of the present invention are shown. The present invention can, however, be embodied in many different forms and should not be construed as being limited to the embodiments set forth herein; rather, these embodiments are provided so that this disclosure will be thorough and complete, and will fully convey the concept of the present invention to those skilled in the art. In the drawings, the thicknesses of layers and regions have been exaggerated for clarity.

Figure 3:
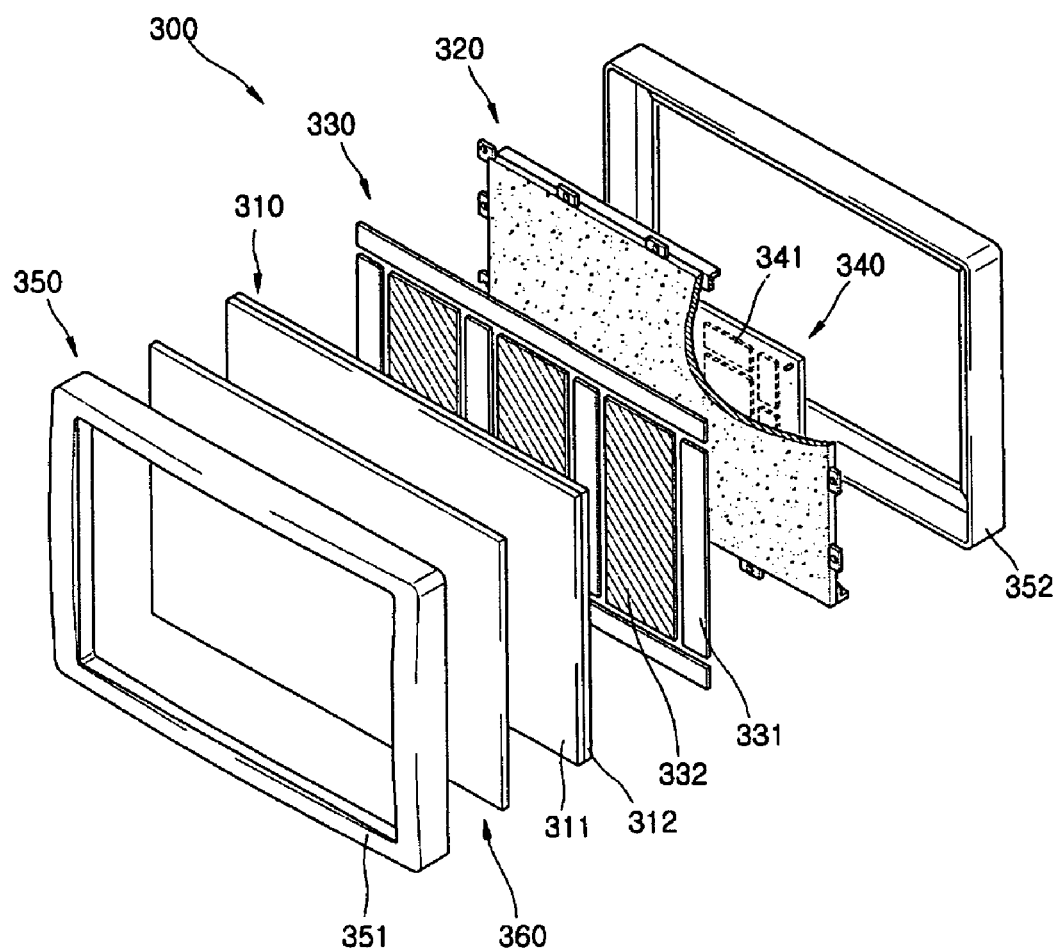
FIG. 3 is an exploded perspective view of a PDP assembly according to an embodiment of the present invention.

FIG. 3 is a view of a PDP assembly according to an embodiment of the present invention.

As shown in FIG. 3, a PDP assembly 300 comprises a panel assembly 310, a chassis base 320 for supporting the panel assembly 310, an adhesive member 330 for adhering the chassis base 320 to the panel assembly 310, a Printed Circuit Board (PCB) 340 arranged on a rear surface of the chassis base 320, and a case 350 for containg the panel assembly 310, the chassis base 320 and the PCB 340.

The panel assembly 310 comprises front and rear panels 311 and 312. The front panel 311 is comprised of sustaining electrodes, a front dielectric layer covering the sustaining electrodes, and a protective layer coated on the front dielectric layer. The rear panel 312 is disposed opposing the front panel 311 and comprises address electrodes, a rear dielectric layer covering the address electrodes, a barrier rib defining a discharge cavity and preventing cross-talk, and a phosphor layer deposited on an inner surface of the barrier rib.

The chassis base 320 is disposed on a rear surface of the panel assembly 310 to support it.

The adhesive member 330 is disposed between the panel assembly 310 and the chassis base 320. The adhesive member 330 includes double-sided tapes 331 and heat dissipating sheets 332 for allowing heat generated by the panel assembly 310 to be dissipated externally via the chassis base 320. That is, the heat dissipating sheets 332 function as a heat conductive medium.

The PCB 340 is arranged on a rear surface of the chassis base 320. A plurality of electronic components 341 for transmitting electrical signals to each electrode terminal are arranged on the PCB 340.

The case 350 comprises a front cabinet 351 arranged on a front side of the panel assembly 310 and a back cover 352 arranged on a rear side of the chassis base 320. That is, the panel assembly 310 and the chassis base 320 that are joined by the adhesive member 330 are contained in a space defined by the front cabinet 351 and the back cover 352 of the case 350.

A filter assembly 360 is disposed on a front surface of the panel assembly 310 to shield Electromagnetic Interference (EMI), infrared rays and neon light and to prevent external light from reflecting.

The filter assembly 360 includes an anti-reflection film for preventing external light from reflecting on the panel assembly 310, an EMI shielding layer for effectively shielding the EMI, and a near infrared shielding film for shielding infrared rays generated by a plasma of inert gas.

According to a feature of the present invention, a heat dissipating unit is provided for effectively dissipating heat away from the chassis base 320 including conduction heat and radiant heat generated by the panel assembly 310. The heat dissipating unit is realized by coating a black material on the chassis base 320 and other members. This will be described in more detail hereinafter.

The heat generated by the PDP assembly 300 includes conduction heat generated by the panel assembly 310 and conducted to the chassis base 320 via the adhesive member 330 and radiant heat generated in the enclosed inner cavity of the PDP assembly. The conducting heat and the radiant heat must be effectively dissipated away from the PDP assembly. Therefore, in the present invention, the heat dissipating unit is provided to effectively absorb the conduction heat as well as the radiant heat and to dissipate the absorbed heat away from the PDP assembly 300.

Figure 4:
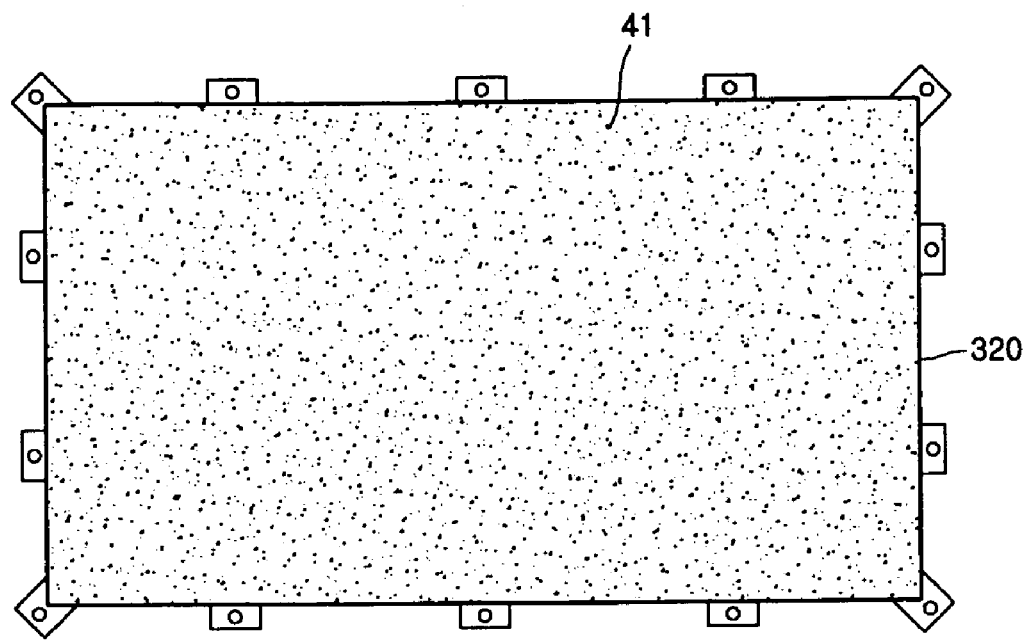
FIG. 4 is a front view of the chassis base of FIG. 3.

Referring to FIG. 4, the heat dissipating unit comprises a heat absorption layer 41 coated on all of a surface of the chassis base 320 facing the panel assembly 310 to improve the absorption efficiency of the radiant heat. The heat absorption layer 41 is preferably formed of a black material such as graphite to enhance the heat absorption efficiency.

Figure 5:
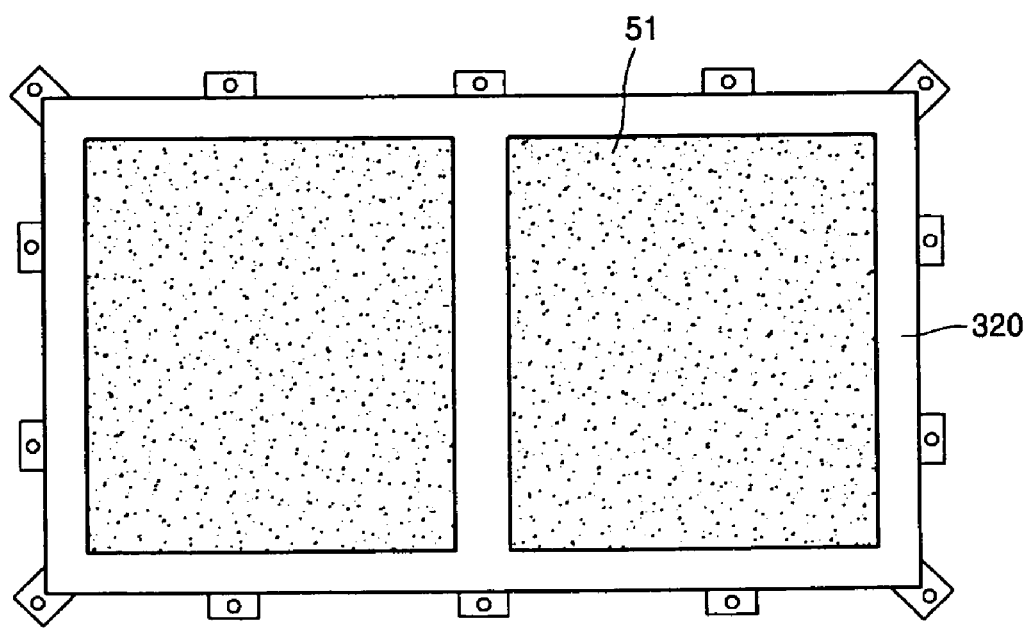
FIG. 5 is a front view of a modified example of the chassis base of FIG. 3.

Alternatively, as shown in FIG. 5, a heat absorption layer 51 can be coated on a portion of the surface of the chassis base 320 to provide areas for the adhesion of the chassis base 320 to the panel assembly 310.

That is, when a heat conduction rate of the heat absorption layer 51 is lower than that of the chassis base 320, it is preferable that the heat absorption layer 51 is partially formed on the chassis base 320 to enlarge a non-coated area, thereby improving the contrast while increasing the heat absorption efficiency. The partial coating of the heat absorption layer 51 can be formed in a stripe or a lattice configuration. However, the present invention is not limited thereto.

The heat absorption layers 41 and 51 further function to absorb light generated by a back discharge to prevent the light from reflecting, thereby improving the contrast of the panel assembly 310.

Experiments for comparing the brightness and contrast obtained when the heat absorption layer 41 is coated with those obtained when the heat absorption layer 41 is not coated were performed. The results are shown in Table 1.

TABLE 1

| Embodiment | Characteristic | Coating (Black) | Non-Coating (White) |
| --- | --- | --- | --- |
| Embodiment 1 | Maximum Brightness (H/L) | 748 cd/m$^2$ | 725 cd/m$^2$ |
| | Darkroom Brightness (L/L) | 0.74 cd/m$^2$ | 1.1 cd/m$^2$ |
| | Contrast | 1011:1 | 659:1 |
| Embodiment 2 | Maximum Brightness (H/L) | 598 cd/m$^2$ | 587 cd/m$^2$ |
| | Darkroom Brightness (L/L) | 0.74 cd/m$^2$ | 1.1 cd/m$^2$ |
| | Contrast | 808:1 | 533:1 |

As shown in Table 1, for Embodiment 1, the maximum brightness was increased from 725 cd/m$^2$ to 748 cd/m$^2$, the darkroom brightness was reduced from 1.1 cd/m$^2$ to 0.74 cd/m$^2$, a the contrast was remarkably increased from 659:1 to 1011:1. In addition, for Embodiment 2, the maximum brightness was increased from 587 cd/m$^2$ to 598 cd/m$^2$, the darkroom brightness was reduced from 1.1 cd/m$^2$ to 0.74 cd/m$^2$, and the contrast was remarkably increased from 533:1 to 808:1.

As described above, when the heat absorption layer formed of the black material is coated on the surface of the chassis base 320, light transmitted through a rear surface of the panel assembly 310 can be absorbed, thereby improving the contrast.

When a ceramic material is added to the heat absorption layers 42 and 51, the adhesive strength of the chassis base 320 to the adhesive member 330 can be enhanced, thereby improving the heat conduction efficiency. Furthermore, when the ceramic material is a bio-ceramic, near infrared rays helpful to health can be radiated.

For example, when a ceramic material such as beryllia is added to the heat absorption layers 41 and 51, a heat conduction rate of the heat absorption layers 41 and 51 is greater than that of the chassis base 320 formed of aluminum. In addition, when the ceramic material is coated at a high temperature, a surface roughness of the heat absorption layers 41 and 51 is improved, thereby enhancing the adhesive strength between the panel assembly 310 and the chassis base 320. The ceramic material further functions to shield EMI.

Figure 6:
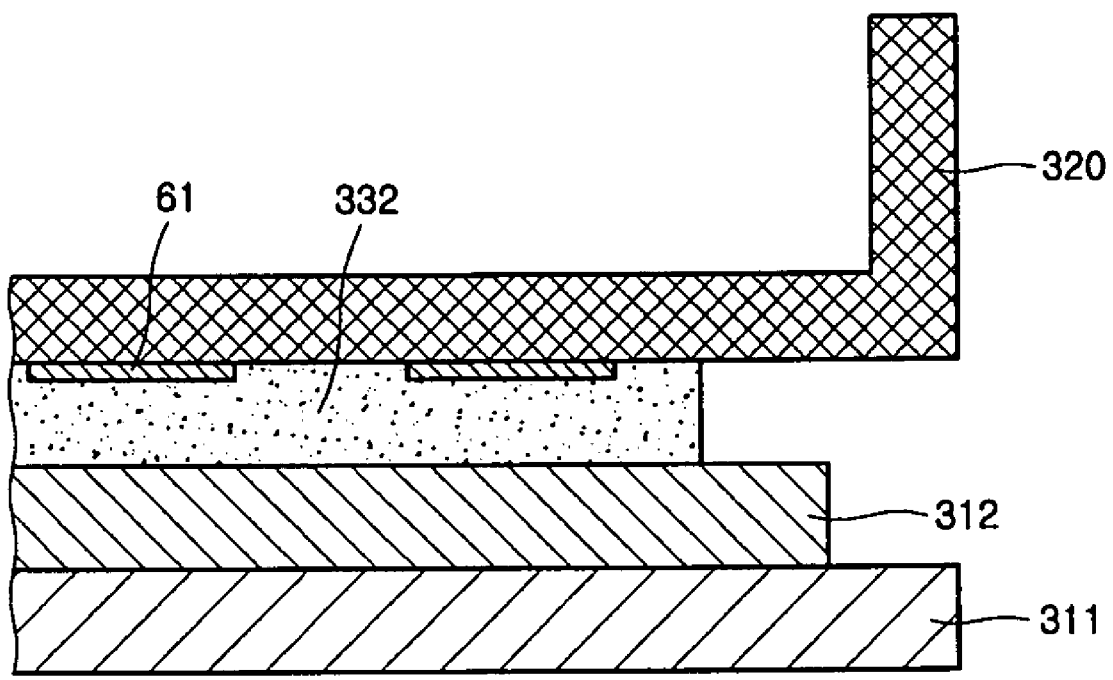
FIG. 6 is a partial sectional view a modified example of the chassis base of FIG. 3.

FIG. 6 is a partial sectional view of FIG. 3, illustrating a modified example of a chassis base.

As shown in FIG. 6, a heat absorption layer 61 is partially coated on a front surface of the chassis base 320 facing the rear panel 312. The heat absorption layer 61 is formed of a plurality of stripes spaced away from each other by a predetermined interval. The heat dissipating sheets 332 are attached on a portion of the front surface of the chassis base 320 on which the heat absorption layer 62 has not been coated.

Since the conduction heat generated by the panel assembly 310 must be conducted to the chassis base 320 via the dissipating sheet 332, the adhesive strength and adhesion area become major factors for dissipating the conduction heat away from the PDP assembly 300. Therefore, as described above, when a heat conduction rate of the heat absorption layer 61 is lower than that of the chassis base 320, it is preferable to enlarge the un-coated area on the front surface of the chassis base 320.

Figure 7:
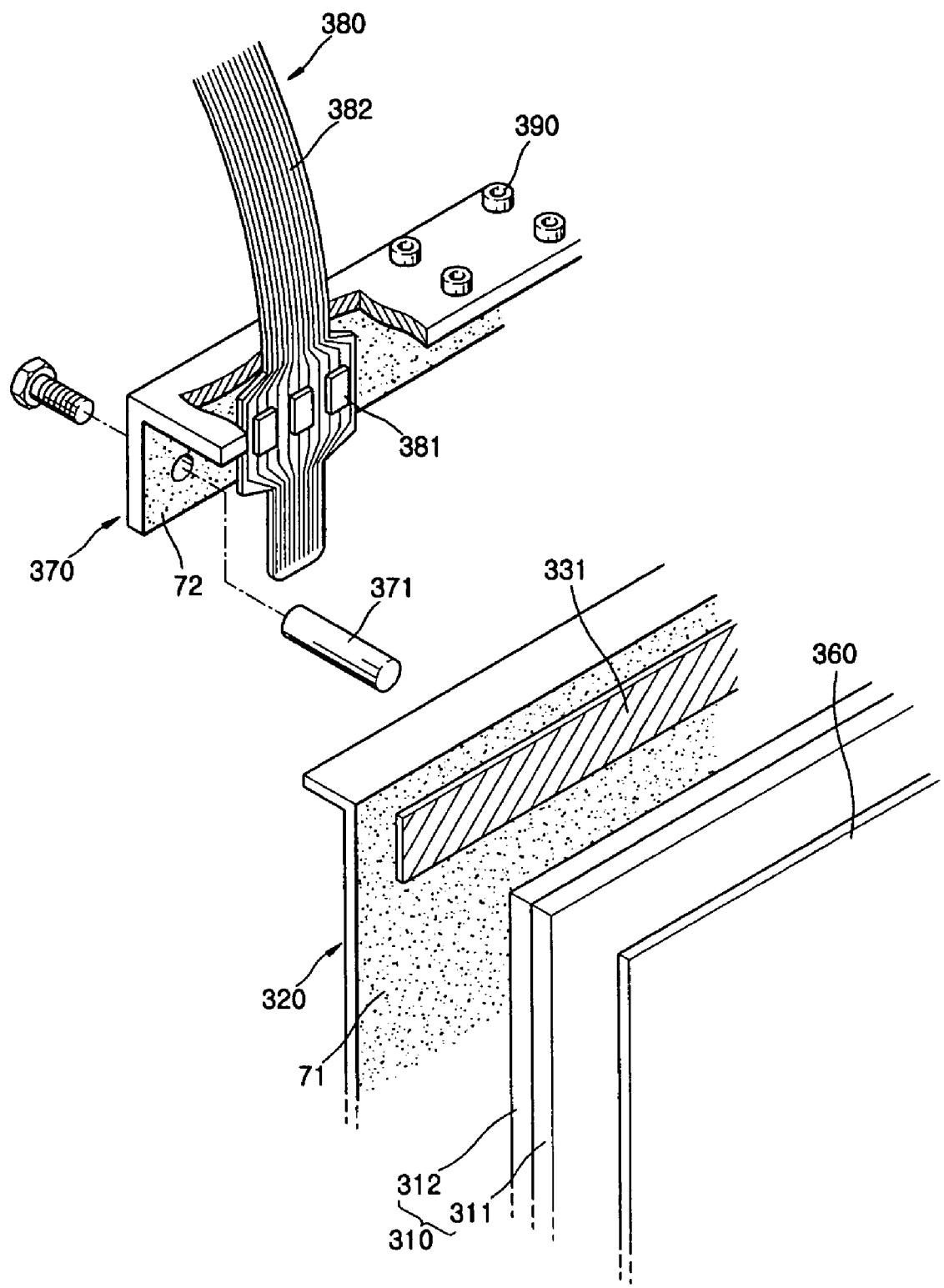
FIG. 7 is an exploded perspective view of a panel assembly, a chassis base and a chassis member according to an embodiment of the present invention.
Figure 8:
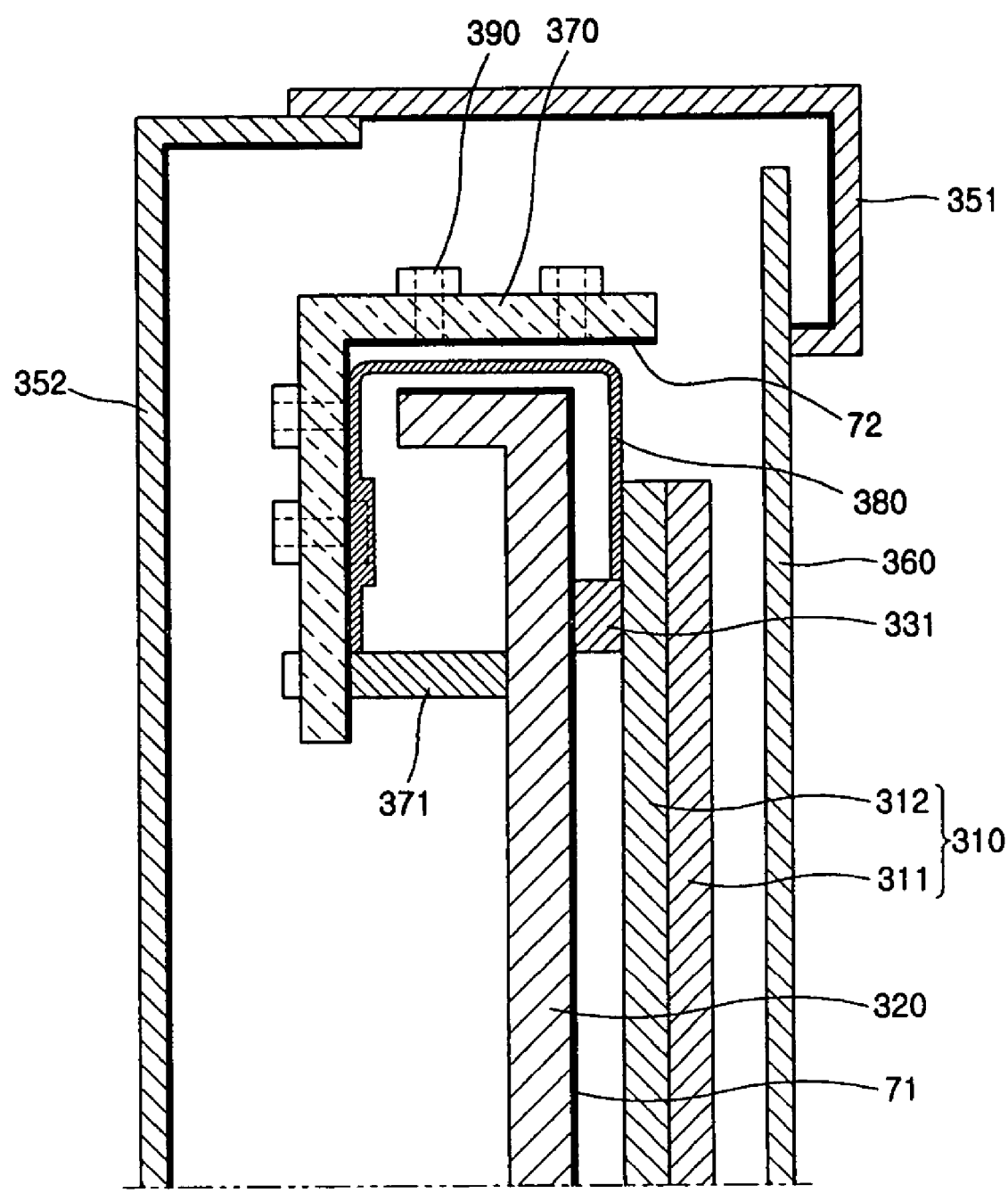
FIG. 8 is an assembled sectional view of the panel assembly, chassis base and chassis member of FIG. 7.

FIG. 7 is an exploded perspective view of a panel assembly, a chassis base and a chassis member according to an embodiment of the present invention, and FIG. 8 is an assembled sectional view of the embodiment of FIG. 7.

Referring to FIGS. 7 and 8, a Flexible Printed Cable (FPC) 380 is provided on the chassis base 320 to transmit electrical signals to the panel assembly 310. The FPC 380 comprises a plurality of Lead on Chips (LOCs) 381 and a plurality of patterned wires 382. The FPC 380 generates a relatively large amount of radiant heat during the operation of the panel assembly 310.

In order to quickly dissipate the conduction heat generated by the FPC 380, the FPC 380 is fixed on a chassis member 370. The chassis member 370 is connected to an upper end of the chassis base 320 by a boss 371 and fixed by a screw.

A heat absorption layer 72 formed of a black material is coated on an inner surface of the chassis member 370 on which the FPC 380 is installed to enhance the dissipation of the radiant heat.

A heat absorption layer 71 is formed on the front surface of the chassis base 320 to absorb and dissipate the radiant heat or conduction heat generated by the panel assembly 310.

According to another feature of the present invention, a heat dissipating unit for quickly dissipating the heat absorbed by the heat absorption layer 72 is provided on the chassis member 370.

Figure 9:
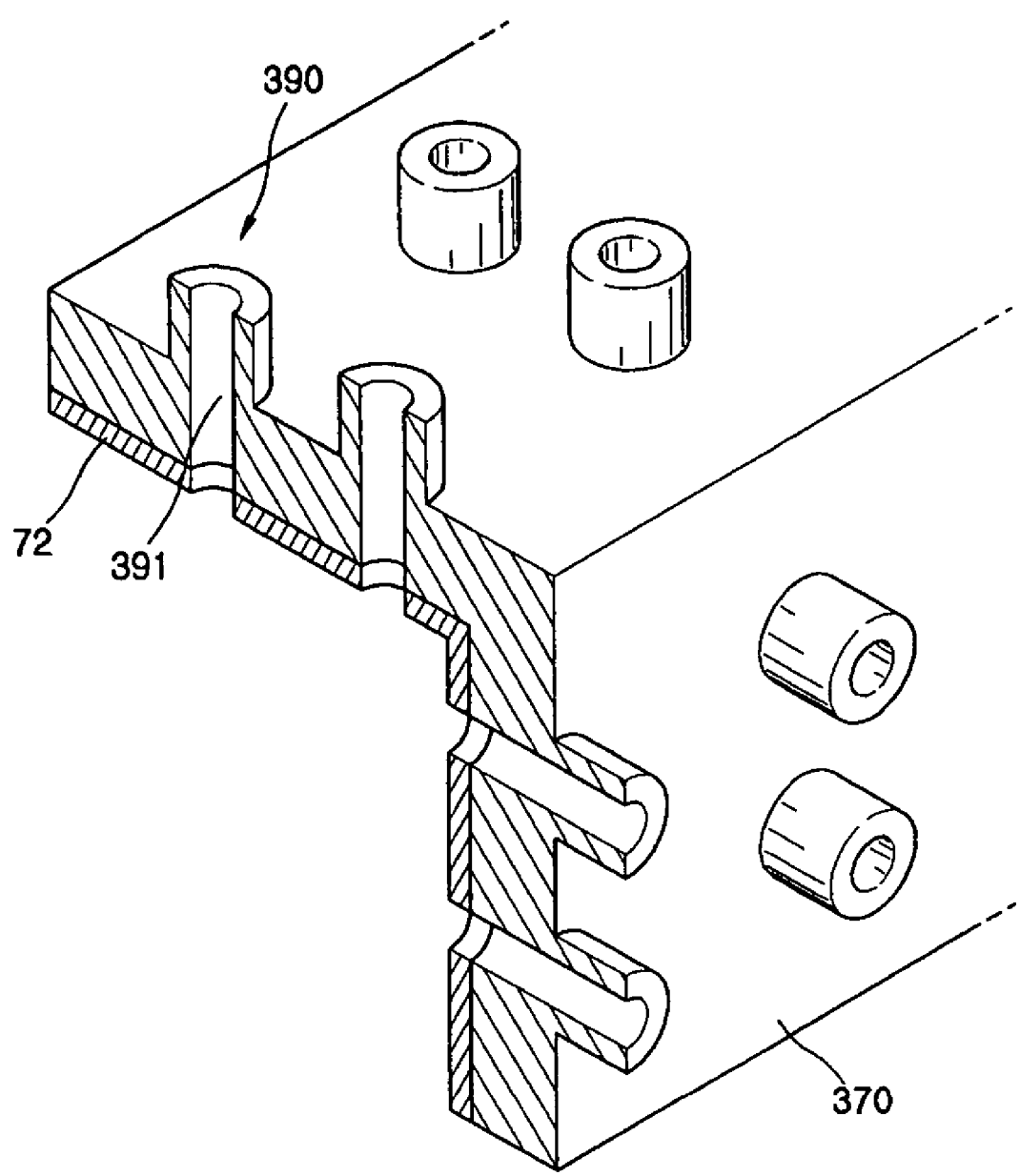
FIG. 9 is a partially broken sectional view of the heat dissipating unit of FIG. 7.

As shown in FIG. 9, the heat dissipating unit comprises a plurality of bosses 390 each provided with through holes 391. The bosses 390 are formed on a surface of the chassis member 370 opposite to the surface on which the heat absorption layer 72 is formed. The bosses 390 of the heat dissipating unit are arranged to be spaced away from each other by a predetermined interval in a longitudinal direction of the chassis member 370.

Figure 10:
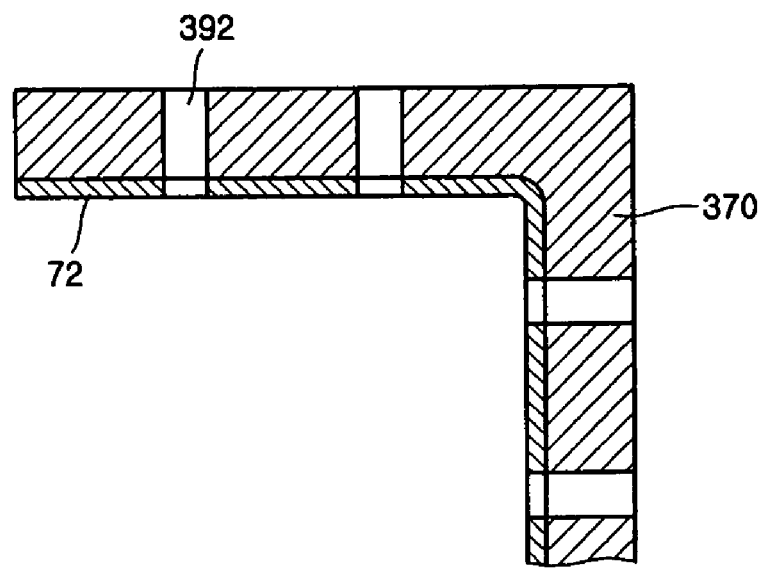
FIG. 10 is a sectional view of a modified example of the heat dissipating unit of FIG. 7.

Alternatively, as shown in FIG. 10, the heat dissipating unit can be simply defined by a plurality of through holes 392 formed in the chassis member 370.

Figure 11:
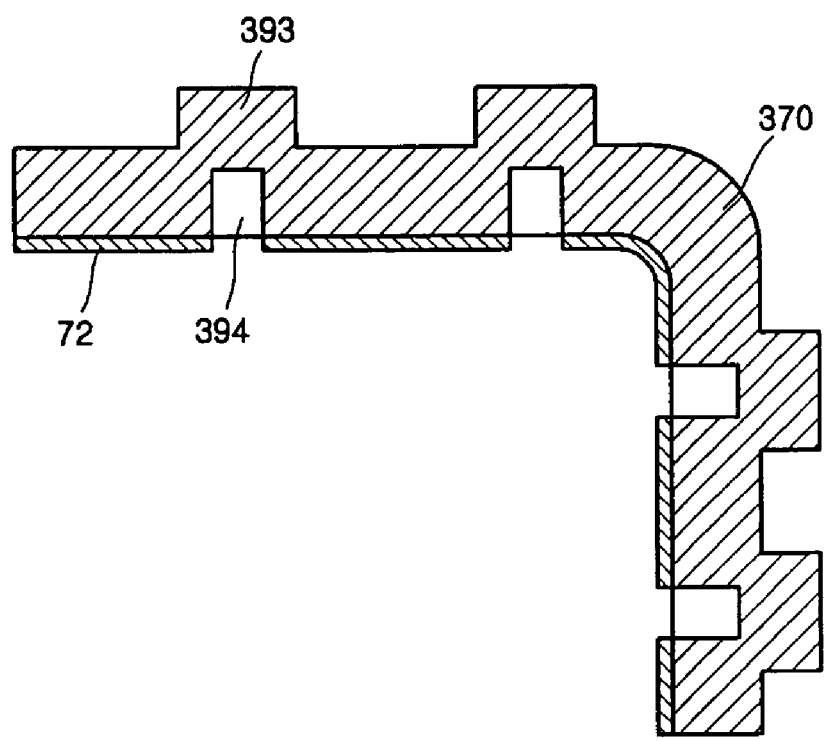
FIG. 11 is a sectional view of a modified example of the heat dissipating unit of FIG. 7.

Alternatively, as shown in FIG. 11, the heat dissipating unit can comprise a plurality of projections 393 formed on a first surface of the chassis member 370 opposite to the surface on which the heat absorption layer 72 has been formed. A plurality of grooves 394, corresponding to the projections 393, are formed on the surface opposite to a first surface of the chassis member 370 to enlarge the heat dissipating area.

Figure 12:
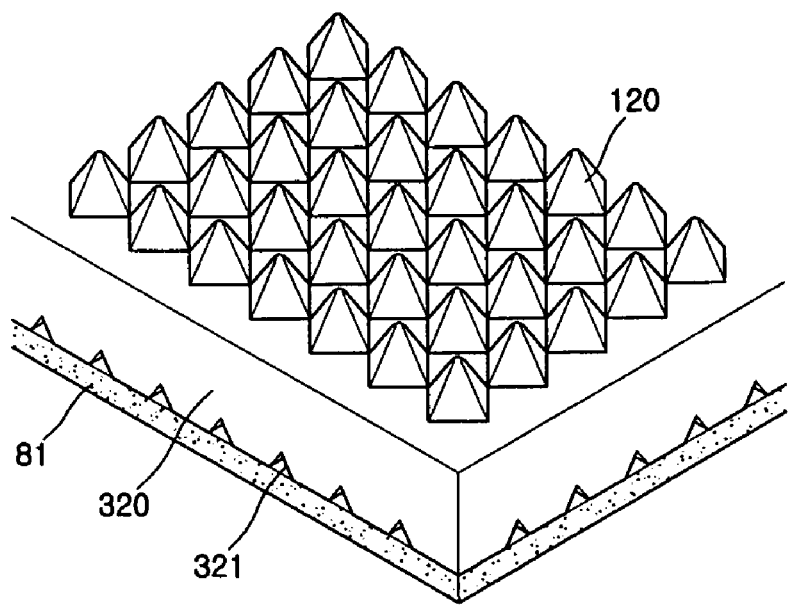
FIG. 12 is a perspective view of a heat dissipating unit formed on a chassis base according to another embodiment of the present invention.

FIG. 12 is a perspective view of a heat dissipating unit formed on a chassis base according to another embodiment of the present invention.

As shown in FIG. 12, a heat absorption layer 81 is coated on a first surface of the chassis base 320 facing the panel assembly 310. A heat dissipating unit is formed on a second surface of the chassis base 320 opposite to the first surface of the chassis base 320 to dissipate the heat absorbed by the heat absorption layer 81 externally.

The heat dissipating unit comprises a plurality of projections 120 extending integrally from the second surface of the chassis base 320. Each of the projections is formed in a pyramid-shape, a triangular prism-shape, or a circular cylindrical-shape. The projections 120 are preferably distributed on the entire second surface to enlarge the heat dissipating area. A plurality of grooves 321 are formed one the first surface of the chassis base 320. The projections 120 and the grooves 321 can be formed by a pressing process. Alternatively, the projections 120 can be formed by a die-casting process.

Figure 13:
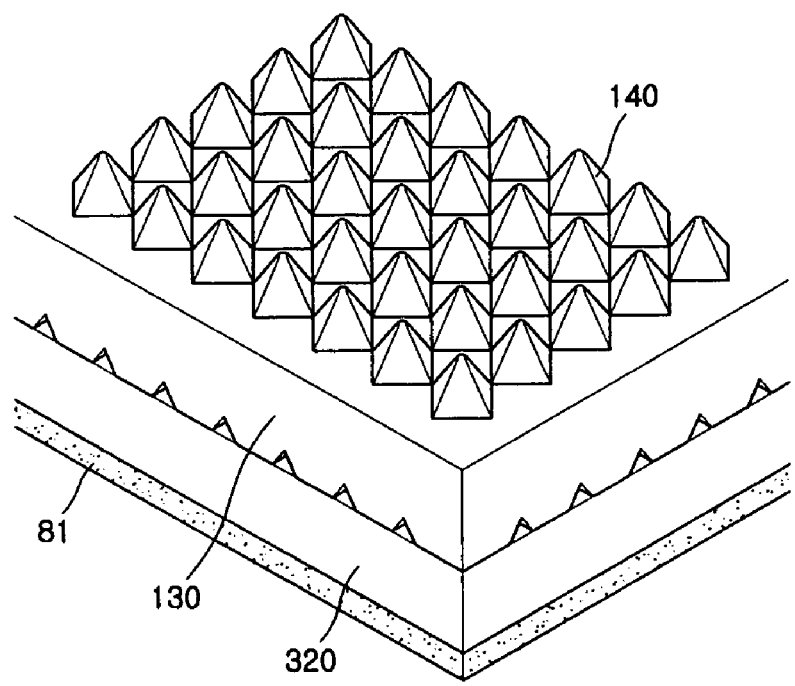
FIG. 13 is a perspective view of a modified example of the heat dissipating unit of FIG. 12.

Alternatively, as shown in FIG. 13, the heat dissipating unit can be separately formed and affixed to the second surface of the chassis base 320. That is, the heat dissipating unit comprises a heat dissipating plate 130 and a plurality of projections 140 formed on the heat dissipating plate 130. The heat dissipating plate 130 is affixed to the chassis base 320.

Figure 14:
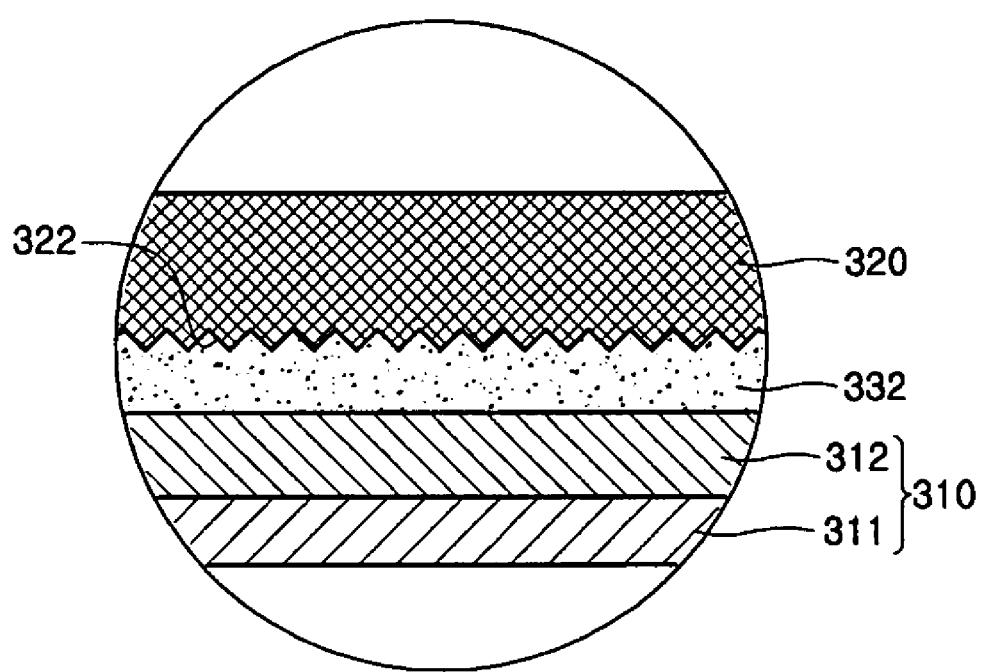
FIG. 14 is a partial enlarged sectional view of a PDP assembly according to another embodiment of the present invention.

FIG. 14 is a partial enlarged sectional view of a PDP assembly according to another embodiment of the present invention.

Referring to FIG. 14, the chassis base 320 is arranged on a surface facing the panel assembly 320 and has a plurality of projections 322 to enhance adhesive strength to the heat dissipating sheets 332 interposed between the chassis base 320 and the panel assembly 310.

A shape and height of the projections 322 are determined according to the softness or hardness of the heat dissipating sheets 332. The projections 332 can be formed by treating the surface of the chassis base 320 through a corroding or sandblasting process or coating pigments on the surface of the chassis base 320.

Since an adhesive area of the surface of the chassis base 320 is increased due to the projections 332, the adhesive strength of the heat dissipating sheet 332 to the surface of the chassis base 320 is increased to prevent the panel assembly from being separated from the chassis base 320.

Particularly, when the projections 322 are formed by coating carbon nanotubes, the heat dissipation efficiency can be improved, thereby improving the heat dissipating efficiency.

Each of the projections 322 can be formed in a discontinuous shape, such as a pyramid-shape, a triangular prism-shape, or a circular cylindrical-shape. Alternatively, the projections 322 can be formed in a strip shape, being spaced away from each other by a predetermined interval.

As described above, the PDP assembly according to the present invention has the following advantages:

1. Since the heat absorption layer is coated on the chassis base and/or other member, the conduction heat and the radiant heat generated by the panel assembly can be quickly absorbed by the heat absorption layer.

2. Since the heat dissipating unit is provided on the chassis base and/or chassis other member, the heat absorbed by the heat absorption layer can be quickly dissipated externally.

3. The heat absorption layer formed of a black material can absorb light generated by a back discharge of the panel assembly, thereby improving the contrast.

4. By adding a ceramic material to the heat absorption layer, the surface roughness of the heat absorption layer is increased, improving the adhesive strength, shielding EMI and generating near infrared rays helpful to health.

5. Since the projections are formed on a surface of the chassis base, the adhesive strength of the chassis base to the heat dissipating sheet can be enhanced.

6. Since the projections are formed of a high heat conductive material, such as carbon nanotubes, the heat conduction efficiency can be improved, thereby improving the heat dissipating efficiency.

While the present invention has been particularly shown and described with reference to exemplary embodiments thereof, it will be understood by those of ordinary skill in the art that various changes in form and details can be made therein without departing from the spirit and scope of the present invention as recited in the following claims.

What is claimed is:

1. A plasma display panel assembly comprising:
a panel assembly;
a chassis base affixed to a rear surface of the panel assembly by an adhesive member;
a printed circuit board arranged on a rear surface of the chassis base;
a case adapted to contain the panel assembly, the chassis base and the printed circuit board; and
a first heat absorption layer arranged in the case and adapted to absorb heat generated by the panel assembly;
wherein the first heat absorption layer partially covers a front surface of the chassis base facing the rear surface of the panel assembly to define an un-coated portion on the front surface of the panel assembly.

2. The plasma display panel assembly of claim 1, wherein the first heat absorption layer comprises a black material.

3. The plasma display panel assembly of claim 2, wherein the black material comprises a graphite-based material.

4. The plasma display panel assembly of claim 2, wherein the first heat absorption layer includes a ceramic material adapted to improve a surface roughness of the heat absorption layer.

5. The plasma display panel assembly of claim 4, wherein the ceramic material comprises beryllia.

6. The plasma display panel assembly of claim 1, further comprising a heat dissipating sheet arranged between the panel assembly and the chassis base, the heat dissipating sheet being affixed to the un-coated portion on the front surface of the panel assembly.

7. The plasma display panel assembly of claim 1, further comprising a chassis member adapted to fix a flexible printed cable adapted to transmit electrical signals to the panel assembly, the chassis member being arranged on the chassis base.

8. The plasma display panel assembly of claim 7, further comprising a second heat absorption layer arranged on a first surface of the chassis member and adapted to absorb heat generated by the flexible printed cable.

9. The plasma display panel assembly of claim 8, further comprising a heat dissipating unit arranged on a second surface of the chassis member and adapted to dissipate the heat absorbed by the second heat absorption layer.

10. The plasma display panel assembly of claim 9, wherein the heat dissipating unit comprises a plurality of bosses integrally projecting from a second surface of the chassis member.

11. The plasma display panel assembly of claim 9, wherein the heat dissipating unit comprises a plurality of through holes arranged to pass through the chassis member.

12. The plasma display panel assembly of claim 9, wherein the heat dissipating unit comprises a plurality of bosses projecting from an outer surface of the chassis member and a plurality of grooves arranged on the first surface to respectively correspond to the plurality of bosses.

13. The plasma display panel assembly of claim 1, further comprising a heat dissipating unit arranged on a rear surface of the chassis base.

14. The plasma display panel assembly of claim 13, wherein the heat dissipating unit comprises a plurality of projections arranged on the rear surface of the chassis base.

15. The plasma display panel assembly of claim 13, wherein the heat dissipating unit comprises a heat dissipating plate affixed to the rear surface of the chassis base and a plurality of projections arranged on the heat dissipating sheet.

16. The plasma display panel assembly of claim 1, wherein the chassis base includes a plurality of projections arranged on a front surface thereof.

17. The plasma display panel assembly of claim 16, wherein the plurality of projections are discontinuous.

18. The plasma display panel assembly of claim 16, wherein the plurality of projections are continuous.

19. The plasma display panel assembly of claim 16, wherein the plurality of projections include carbon nanotubes adapted to increase a heat dissipating area.

20. The plasma display panel assembly of claim 16, wherein the plurality of projections are formed by a process selected from the group consisting of etching, sandblasting, coating, and pressing.

21. A plasma display panel assembly comprising:
a panel assembly;
a chassis base affixed to a rear surface of the panel assembly;
a case adapted to contain the panel assembly and the chassis base; and
a first heat absorption layer arranged in the case and adapted to absorb heat generated by the panel assembly;
wherein the first heat absorption layer partially covers a front surface of the chassis base facing the rear surface of the panel assembly to define an un-coated portion on the front surface of the panel assembly.

22. The plasma display panel assembly of claim 21, wherein the first heat absorption layer comprises a black material.

23. The plasma display panel assembly of claim 22, wherein the black material comprises a graphite-based material.

24. The plasma display panel assembly of claim 22, wherein the first heat absorption layer includes a ceramic material adapted to improve a surface roughness of the heat absorption layer.

25. The plasma display panel assembly of claim 24, wherein the ceramic material comprises beryllia.

26. The plasma display panel assembly of claim 21, further comprising a heat dissipating sheet arranged between the panel assembly and the chassis base, the heat dissipating sheet being affixed to the un-coated portion on the front surface of the panel assembly.

27. The plasma display panel assembly of claim 21, further comprising a chassis member adapted to fix a flexible printed cable adapted to transmit electrical signals to the panel assembly, the chassis member being arranged on the chassis base.

* * * * *